United States Patent
Xu

(10) Patent No.: US 12,224,280 B2
(45) Date of Patent: Feb. 11, 2025

(54) ELECTROSTATIC DISCHARGE PROTECTION CIRCUIT INCLUDING A PULSE DETECTION CIRCUIT

(71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 661 days.

(21) Appl. No.: 17/376,112

(22) Filed: Jul. 14, 2021

(65) Prior Publication Data

US 2021/0343702 A1 Nov. 4, 2021

Related U.S. Application Data

(63) Continuation of application No. PCT/CN2021/079537, filed on Mar. 8, 2021.

(30) Foreign Application Priority Data

Mar. 26, 2020 (CN) .......................... 202010224088.0

(51) Int. Cl.
*H01L 27/02* (2006.01)
*H02H 9/04* (2006.01)
*H03K 17/081* (2006.01)

(52) U.S. Cl.
CPC ...... *H01L 27/0266* (2013.01); *H01L 27/0288* (2013.01); *H02H 9/045* (2013.01); *H03K 17/08104* (2013.01)

(58) Field of Classification Search
CPC ............. H01L 27/0266; H01L 27/0288; H01L 27/0285; H02H 9/045; H02H 3/046; H03K 17/08104

(Continued)

(56) References Cited

U.S. PATENT DOCUMENTS 6,912,109 B1   6/2005  Ker
7,085,113 B2 * 8/2006  Gauthier, Jr. ....... H01L 27/0266
                                                  361/111

(Continued)

FOREIGN PATENT DOCUMENTS

CN    1501757 A    6/2004
CN    1596058 A    3/2005

(Continued)

OTHER PUBLICATIONS

A kind of power clamp circuit for ESD protection. Du ,Wei . Shenzhen Signal Microelectronic Technology Co Ltd 109245078-Desc-en.pdf (Year: 2019).*

(Continued)

*Primary Examiner* — Kimberly N Rizkallah
*Assistant Examiner* — Pratiksha Jayant Lohakare
(74) *Attorney, Agent, or Firm* — Syncoda LLC; Feng Ma

(57) ABSTRACT

An electrostatic discharge protection circuit includes: a pulse detection unit, a delay unit, a control unit, and a discharge unit. The pulse detection unit is configured to detect an electrostatic pulse signal; the delay unit is configured to delay or enhance driving capability of the pulse detection signal output by the pulse detection unit; the control unit is configured to generate a control signal based on a first delay signal and a second delay signal output by the delay unit; and the discharge unit is configured to open or close an electrostatic charge discharge passage based on the control signal output by the control unit.

8 Claims, 2 Drawing Sheets

(58) Field of Classification Search
USPC .......................................................... 257/355
See application file for complete search history.

(56) References Cited

U.S. PATENT DOCUMENTS

| | | | | |
|---|---|---|---|---|
| 7,453,676 | B2 * | 11/2008 | Huh | ................. H02H 9/046 361/56 |
| 7,808,754 | B2 * | 10/2010 | Jang | ................. H02H 9/046 361/111 |
| 8,369,054 | B2 | 2/2013 | Cai | |
| 8,969,914 | B2 | 3/2015 | Chalamala | |
| 9,356,442 | B2 * | 5/2016 | Cai | ................. H02H 9/046 |
| 9,531,188 | B2 | 12/2016 | Wang | |
| 9,825,022 | B2 * | 11/2017 | Chen | ................. H01L 27/0266 |
| 11,056,481 | B2 * | 7/2021 | Yeh | ................. H01L 27/0641 |
| 2005/0035806 | A1 | 2/2005 | El-Sherif | |
| 2006/0039093 | A1 | 2/2006 | Gauthier, Jr. | |
| 2007/0109697 | A1 * | 5/2007 | Huh | ................. H02H 9/046 361/56 |
| 2007/0171587 | A1 * | 7/2007 | Lee | ................. H01L 27/0285 361/56 |
| 2008/0304191 | A1 * | 12/2008 | Riviere | ............. H01L 27/0285 361/111 |
| 2009/0040671 | A1 | 2/2009 | Zhang | |
| 2014/0211357 | A1 * | 7/2014 | Matsuoka | ........... H01L 23/5223 361/111 |
| 2015/0084702 | A1 * | 3/2015 | Tesch | ................. H02H 9/046 330/298 |
| 2015/0295399 | A1 | 10/2015 | Wang et al. | |
| 2019/0006841 | A1 | 1/2019 | Singh | |

FOREIGN PATENT DOCUMENTS

| | | | |
|---|---|---|---|
| CN | 101060754 A | 10/2007 | |
| CN | 101197500 A | 6/2008 | |
| CN | 101707363 A | 5/2010 | |
| CN | 103646945 A | 3/2014 | |
| CN | 108878416 A | 11/2018 | |
| CN | 209823413 U | 12/2019 | |
| CN | 115173384 A * | 10/2022 | ......... H01L 27/0266 |

OTHER PUBLICATIONS

Integrated circuit power supply esd protection circuit, Li et al Beijing CEC Huada Electronic Design Co Ltd, 2013 (Year: 2013).*
First Office Action of the Chinese application No. 202010224088.0, issued on Jan. 24, 2022.
International Search Report in the international application No. PCT/CN2021/079537, mailed on May 25, 2021.
Supplementary European Search Report in the European application No. 21774448.1 , mailed on Oct. 4, 2022.
Written Opinion of the International Search Authority in the international application No. PCT/CN2021/079537, mailed on May 25, 2021.
Notice of Allowance of the Chinese application No. 202010224088. 0, issued on May 6, 2022.

* cited by examiner

ELECTROSTATIC DISCHARGE PROTECTION CIRCUIT INCLUDING A PULSE DETECTION CIRCUIT

CROSS-REFERENCE TO RELATED APPLICATIONS

This application is a continuation of International Application No. PCT/CN2021/079537 filed on Mar. 8, 2021, which claims priority to China Patent Application No. 202010224088.0 filed on Mar. 26, 2020. The disclosures of these applications are hereby incorporated by reference in their entirety.

BACKGROUND

With more and more advanced semiconductor manufacturing processes, semiconductor devices have less junction depths and thinner oxide layers and become smaller and smaller, bringing huge challenges to the reliability of semiconductor integrated circuits. Therefore, electrostatic protection becomes more and more important. Statistics show that many of semiconductor product failures are caused by electrostatic damage. Thus, in order to better protect an integrated circuit from electrostatic damage, an electrostatic discharge protection circuit is required to protect the integrated circuit.

SUMMARY

The present disclosure relates generally to the technical field of integrated circuits, and more specifically to an electrostatic discharge protection circuit.

In an aspect of the present disclosure, there is provided an electrostatic discharge protection circuit, the electrostatic discharge protection circuit includes a pulse detection unit, a delay unit, a control unit and a discharge unit.

The pulse detection unit is configured to detect an electrostatic pulse signal, the pulse detection unit has a first end connected to a first voltage, a second end connected to a second voltage, and a third end outputting a pulse detection signal.

The delay unit is configured to delay or enhance driving capability of the pulse detection signal, the delay unit has a first end connected to the first voltage, a second end connected to the second voltage, a third end connected to the third end of the pulse detection unit, a fourth end outputting a first delay signal, and a fifth end outputting a second delay signal.

The control unit is configured to generate a control signal based on the first delay signal and the second delay signal, the control unit has a first end connected to the first voltage, a second end connected to the second voltage, a third end connected to the fifth end of the delay unit, a fourth end connected to the fourth end of the delay unit, and a fifth end outputting the control signal.

The discharge unit is configured to open or close an electrostatic charge discharge passage based on the control signal, the discharge unit has a first end connected to the first voltage, a second end connected to the second voltage, and a third end connected to the fifth end of the control unit.

In the technical solutions of the present disclosure, the electrostatic discharge protection circuit can achieve a desired electrostatic protection in a case of a small RC time constant, and the electrostatic discharge protection circuit also has a small area and would take up a small design space. Moreover, noise influences can be avoided and the performance of the electrostatic protection circuit can be improved. In addition, the abovementioned electrostatic discharge protection circuit can provide electrostatic protection of two electrostatic discharge modes, such that the electrostatic protection capability of a product can be improved effectively.

BRIEF DESCRIPTION OF THE DRAWINGS

Embodiments of the present disclosure are described below with reference to one or more accompanying drawings for better description and illustration. However, additional details or examples for description of the accompanying drawings should not be construed as limiting the scope of any one of the invention, embodiments described herein, or preferred modes of the present disclosure.

DETAILED DESCRIPTION

In order to facilitate understanding of the disclosure, the disclosure will now be described more fully below with reference to accompanying drawings. Preferred embodiments of the present disclosure are illustrated in the accompanying drawings. However, the present disclosure may be embodied in many different forms and is not limited to the embodiments described herein. Rather, these embodiments are provided so that the content of the present disclosure will be more thorough and complete.

It should be noted that when an element is referred to being "connected" to the other element, the element may be directly connected to and integrated with the other element, or there may be an intermediate element between them. The terms used herein such as "mounted", "one end", and "another end" are only for the purpose of illustration.

Unless otherwise defined, all technical and scientific terms used herein have the same meaning as commonly understood by those skilled in the art to which the present disclosure belongs. The terms used in the specification of the present disclosure are for the purpose of describing specific embodiments only and are not intended to limit of the present disclosure. The term "and/or" used herein comprises any and all combinations of the one or more listed items.

Generally, an integrated circuit product has an electrostatic protection, and each lead-out pad has a corresponding electrostatic protection circuit. These protection circuits are able to ensure that all the lead out pads can implement quick electrostatic discharge (ESD) when the ESD is occurred, such that the integrated circuit product can be protected from the ESD damage. In order to ensure that an electrostatic current is able to be fully discharged during a duration of occurrence of static electricity, resistance and capacitance of an existing electrostatic discharge protection circuit would take up a relatively large design space. In other words, the existing electrostatic discharge protection circuit requires a large resistance-capacitance (RC) time constant to achieve a better electrostatic protection, which would lead to a large area of the electrostatic discharge protection circuit. In addition, the existing electrostatic protection circuit is also sensitive to noise.

Figure 1:
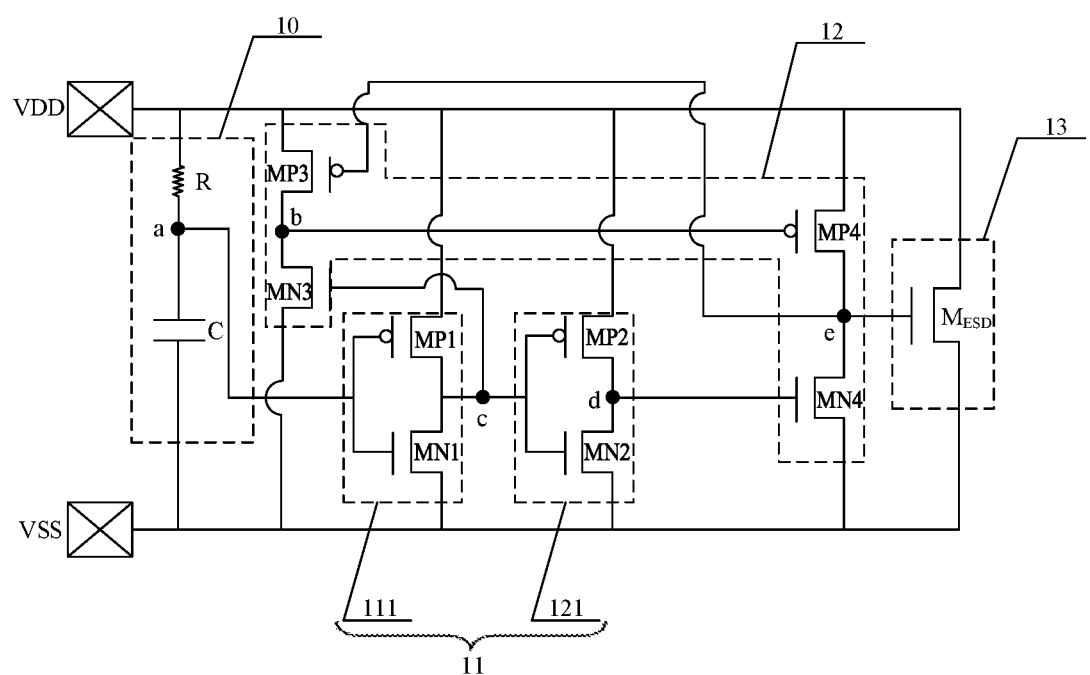
FIG. 1 is a circuit diagram of an electrostatic discharge protection circuit in some embodiments.

In some embodiments, as illustrated in FIG. 1, the disclosure provides an electrostatic discharge protection circuit. The electrostatic discharge protection circuit includes a pulse detection unit 10, a delay unit 11, a control unit 12 and a discharge unit 13. The pulse detection unit 10 is configured to detect an electrostatic pulse signal, the pulse detection unit has a first end connected to a first voltage VDD, a second end connected to a second voltage VSS, and a third end outputting a pulse detection signal. The delay unit 11 is configured to delay or enhance driving capability of the pulse detection signal, the delay unit has a first end connected to the first voltage VDD, a second end connected to the second voltage VSS, a third end connected to the third end of the pulse detection unit 10, a fourth end outputting a first delay signal, and a fifth end outputting a second delay signal. The control unit 12 is configured to generate a control signal based on the first delay signal and the second delay signal, the control unit has a first end connected to the first voltage VDD, a second end connected to the second voltage VSS, a third end connected to the fifth end of the delay unit 11, a fourth end connected to the fourth end of the delay unit 11, and a fifth end outputting the control signal. The discharge unit 13 is configured to open or close an electrostatic charge discharge passage based on the control signal, the discharge unit has a first end connected to the first voltage VDD, a second end connected to the second voltage VSS, and a third end connected to the fifth end of the control unit 12.

The electrostatic discharge protection circuit described above can achieve a desired electrostatic protection in a case of a small RC time constant, and the electrostatic discharge protection circuit also has a small area and would take up a small design space. Moreover, noise influences can be avoided and the performance of the electrostatic protection circuit can be improved. In addition, the abovementioned electrostatic discharge protection circuit can provide electrostatic protection of two electrostatic discharge modes, such that the electrostatic protection capability of a product can be improved effectively.

In an example, the pulse detection unit 10 may include a resistor R and a capacitor C. The resistor R has a first end used as the first end of the pulse detection unit 10 and connected to the first voltage VDD, and the resistor R has a second end used as the third end of the pulse detection unit 10. The capacitor C has a first end connected to the second end of the resistor R, and the capacitor C has a second end used as the second end of the pulse detection unit 10 and connected to the second voltage VSS.

Specifically, the resistor R may include, but not limited to, a polysilicon resistor or a doped resistor.

Specifically, the capacitor C may include, but not limited to, a metal-dielectric layer-metal capacitor or a Metal-Oxide-Semiconductor (MOS) capacitor.

Specifically, a product of resistance of the resistor R and capacitance of the capacitor C may be a constant. More specifically, the product of the resistance of the resistor R and the capacitance of the capacitor C may have a value from 0.01 us (i.e., microsecond) to 1 us.

In an example, the delay unit 11 may include a first inverter 111 and a second inverter 121. The first inverter 111 has a first end used as the third end of the delay unit 11 and connected to the third end of the pulse detection unit 10, the first inverter 111 has a second end connected to the first voltage VDD, the first inverter 111 has a third end connected to the second voltage VSS, and the first inverter 111 has a fourth end used as the fourth end of the delay unit 11. The second inverter 121 has a first end connected to the fourth end of the first inverter 111, the second inverter 121 has a second end connected to the first voltage VDD, the second inverter 121 has a third end connected to the second voltage VSS, and the second inverter 121 has a fourth end used as the fifth end of the delay unit 11.

In an example, the first inverter 111 may include a first P-channel MOS (PMOS) transistor MP1 and a first N-channel MOS (NMOS) transistor MN1. A gate of the first PMOS transistor MP1 and a gate of the first NMOS transistor MN1 are connected together and used as the first end of the first inverter 111. A source of the first PMOS transistor MP1 is used as the second end of the first inverter 111 and connected to the first voltage VDD. A drain of the first PMOS transistor MP1 and a drain of the first NMOS transistor MN1 are connected together and used as the fourth end of the first inverter 111. A source of the first NMOS transistor MN1 is used as the third end of the first inverter 111 and connected to the second voltage VSS.

In an example, the second inverter 121 may include a second PMOS transistor MP2 and a second NMOS transistor MN2. A gate of the second PMOS transistor MP2 and a gate of the second NMOS transistor MN2 are connected together to use as the first end of the second inverter 121 and connected to the fourth end of the first inverter. A source of the second PMOS transistor MP2 is used as the second end of the second inverter 121 and connected to the first voltage VDD. A drain of the second PMOS transistor MP2 and a drain of the second NMOS transistor MN2 are connected together and used as the fourth end of the second inverter 121. A source of the second NMOS transistor MN2 is used as the third end of the second inverter 121 and connected to the second voltage VSS.

In an example, the control unit 12 may include a third PMOS transistor MP3, a third NMOS transistor MN3, a fourth PMOS transistor MP4 and a fourth NMOS transistor MN4. A source of the third PMOS transistor MP3 is connected to the first voltage VDD. A gate of the third NMOS transistor MN3 is used as the fourth end of the control unit 12 and connected to the fourth end of the first inverter 111, a drain of the third NMOS transistor MN3 is connected to a drain of the third PMOS transistor MP3, and a source of the third NMOS transistor MN3 is used as the second end of the control unit 12 and connected to the second voltage VSS. A gate of the fourth PMOS transistor MP4 is connected to the drain of the third PMOS transistor MP3 and the drain of the third NMOS transistor MN3, and a source of the fourth PMOS transistor MP4 is connected to the first voltage VDD. A gate of the fourth NMOS transistor MN4 is used as the third end of the control unit 12 and connected to the fourth end of the second inverter 121, a drain of the fourth NMOS transistor MN4 is connected to a drain of the fourth PMOS transistor MP4 and a gate of the third PMOS transistor MP3 and used as the fifth end of the control unit 12.

In an example, the discharge unit 13 may include a discharge transistor MESD. Specifically, the discharge transistor MESD may be an NMOS transistor. A drain of the discharge transistor MESD is used as the first end of the discharge unit 13 and connected to the first voltage VDD; a source of the discharge transistor MESD is used as the second end of the discharge unit 13 and connected to the second voltage VSS; and a gate of the discharge transistor MESD is used as the third end of the discharge unit 13 and connected to the fifth end of the control unit 12.

The operation principle of the electrostatic discharge protection circuit illustrated in FIG. 1 is described as follows.

In a case of normal operation, the third end (i.e., an end a in FIG. 1) of the pulse detection unit 10 is at a high level, after the first inverter 111 which includes the first PMOS transistor MP1 and the first NMOS transistor MN1 is passed through, the fourth end (i.e., an end c in FIG. 1) of the first inverter 111 is at a low level. Then, after the second inverter 121 which includes the second PMOS transistor MP2 and the second NMOS transistor MN2 is passed through, the fourth end (i.e., an end d in FIG. 1) of the second inverter 121 is at a high level. Accordingly, the fourth NMOS transistor MN4 is on and the fifth end (i.e., an end e in FIG. 1) of the control unit 12 is at a low level, it is ensured that the discharge transistor MESD is off. Moreover, the fifth end of the control unit 12 is at a low level, thus an end b in the figure may be at a high level after feedback, and then the fourth PMOS transistor MP4 is off. In such way, it is better ensured that the fifth end of the control unit 12 is at a low level, which can further ensure that the discharge transistor MESD would not leak.

When static electricity occurs in a positive-to-VSS (PS) mode (VSS is grounded and a positive electrostatic pulse is generated at VDD), the third end (i.e., the end a in FIG. 1) of the pulse detection unit 10 is at a low level, after the first inverter 111 which includes the first PMOS transistor MP1 and the first NMOS transistor MN1 is passed through, the fourth end (i.e., the end c in FIG. 1) of the first inverter 111 is at a high level. Then, after the second inverter 121 which includes the second PMOS transistor MP2 and the second NMOS transistor MN2 is passed through, the fourth end (i.e., the end d in FIG. 1) of the second inverter 121 is at a low level, and then the fourth NMOS transistor MN4 is off. Since the fourth end (i.e., the end c in FIG. 1) of the first inverter 111 is at a high level, the third NMOS transistor MN3 is on, the end b in FIG. 1 is at a low level, and the fourth PMOS transistor MP4 is on, then the fifth end (i.e., the end e in FIG. 1) of the control unit 12 is at a high level, which ensures that the discharge transistor MESD is on and the electrostatic current is discharged. With an increase of action time of ESD, the level at the third end (i.e., the end a in FIG. 1) of the pulse detection unit 10 gradually increases, and the level at the point d also increases after the delay unit 11 is passed through. Accordingly, the level at the point e gradually decreases, and the level at the point b also increases. However, since the level at the point c gradually decreases, the level at the point b accordingly decreases. In such way, as the increase of the action time increase of ESD, the level at the point b may be both pulled up and pulled down, thus the level decrease of the point b may be delayed, and the level decrease of the point e may be further delayed. In the process of increase of the action time of ESD, the electrostatic discharge protection circuit can prolong the time of the end e in FIG. 1 being at a high level, it is ensured that the discharge transistor MESD can be effectively turned on to discharge the electrostatic current during a duration of operation of the static electricity in the case of a small RC time constant.

Figure 2:
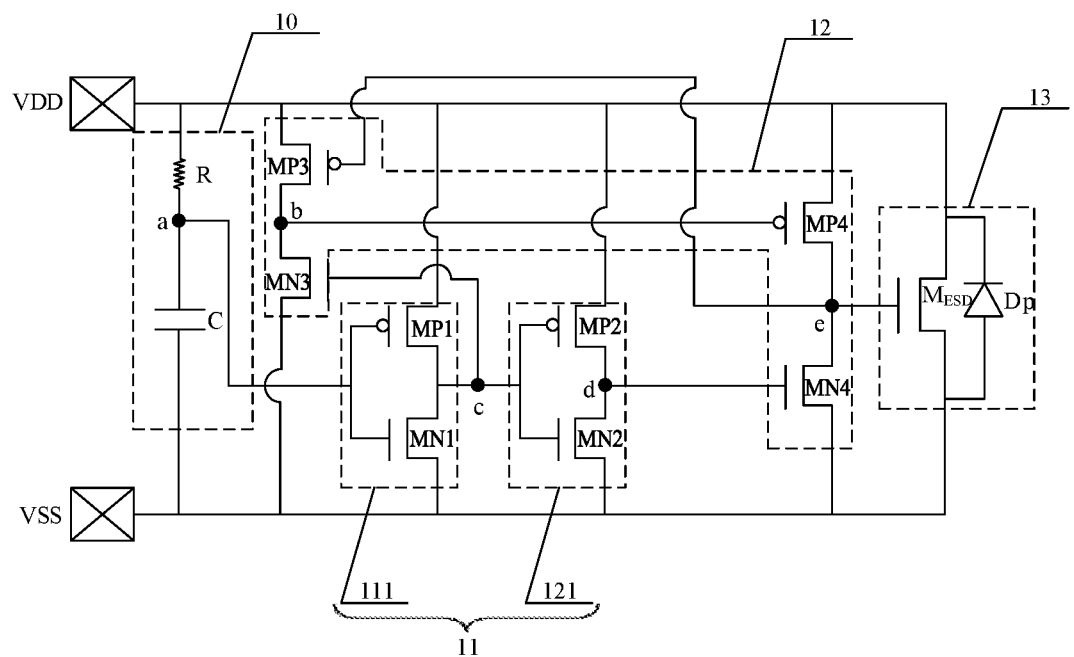
FIG. 2 is a circuit diagram of electrostatic protection of an electrostatic discharge protection circuit in a negative-to-VSS (NS) mode in some embodiments.

When static electricity occurs in a NS mode (VSS is grounded and a negative pulse is generated at VDD), as illustrated in FIG. 2, a parasitic diode Dp which is formed by the discharge transistor MESD discharges the electrostatic current, such that the electrostatic discharge protection in the NS mode can be achieved.

Various technical features described in the foregoing embodiments may be combined in any way. In order to provide a concise description, not all possible combinations of the various technical features in the foregoing embodiments are described. However, theses combinations of the technical features should be regarded as falling within the scope of the present specification as long as these combinations do not contradict.

The foregoing embodiments only describe several implementation modes of the present disclosure specifically and in detail, but these embodiments should not be construed as limiting the scope of the present disclosure. It should be noted that various variations and improvements made by those of ordinary skill in the art without departing from the conception of the present disclosure shall be regarded as falling within the protection scope of the present disclosure. Therefore, the protection scope of the present disclosure should be subject to the appended claims.

What is claimed is:

1. An electrostatic discharge protection circuit, comprising:
    a pulse detection circuit, configured to detect an electrostatic pulse signal, the pulse detection circuit having a first end connected to a first voltage, a second end connected to a second voltage, and a third end configured to output a pulse detection signal;
    a delay circuit, configured to delay or enhance driving capability of the pulse detection signal, the delay circuit having a first end connected to the first voltage, a second end connected to the second voltage, a third end connected to the third end of the pulse detection circuit, a fourth end configured to output a first delay signal, and a fifth end configured to output a second delay signal;
    a control circuit, configured to generate a control signal based on the first delay signal and the second delay signal, the control circuit having a first end connected to the first voltage, a second end connected to the second voltage, a third end connected to the fifth end of the delay circuit, a fourth end connected to the fourth end of the delay circuit, and a fifth end configured to output the control signal; and
    a discharge circuit, configured to open or close an electrostatic charge discharge passage based on the control signal, the discharge circuit having a first end connected to the first voltage, a second end connected to the second voltage, and a third end connected to the fifth end of the control circuit;
    wherein the delay circuit comprises:
    a first inverter having a first end used as the third end of the delay circuit, a second end connected to the first voltage, a third end connected to the second voltage, and a fourth end used as the fourth end of the delay circuit; and
    a second inverter having a first end connected to the fourth end of the first inverter, a second end connected to the first voltage, a third end connected to the second voltage, and a fourth end used as the fifth end of the delay circuit;
    wherein the control circuit comprises:
    a third PMOS transistor, a source of the third PMOS transistor being connected to the first voltage;
    a third NMOS transistor, a gate of the third NMOS transistor being connected to the fourth end of the first inverter, a drain of the third NMOS transistor being connected to a drain of the third PMOS transistor, and a source of the third NMOS transistor being connected to the second voltage;
    a fourth PMOS transistor, a gate of the fourth PMOS transistor being connected to the drain of the third PMOS transistor and the drain of the third NMOS transistor, and a source of the fourth PMOS transistor being connected to the first voltage; and
    a fourth NMOS transistor, a gate of the fourth NMOS transistor being connected to the fourth end of the second inverter, a drain of the fourth NMOS transistor being connected to a drain of the fourth PMOS transistor and a gate of the third PMOS transistor and used as the fifth end of the control circuit.

2. The electrostatic discharge protection circuit of claim 1, wherein the first inverter comprises a first P-channel Metal-Oxide-Semiconductor (PMOS) transistor and a first N-channel MOS (NMOS) transistor; a gate of the first PMOS transistor and a gate of the first NMOS transistor are connected together and used as the first end of the first inverter; a source of the first PMOS transistor is used as the second end of the first inverter; a drain of the first PMOS transistor and a drain of the first NMOS transistor are connected together and used as the fourth end of the first inverter; and a source of the first NMOS transistor is used as the third end of the first inverter; and the second inverter comprises a second PMOS transistor and a second NMOS transistor;

a gate of the second PMOS transistor and a gate of the second NMOS transistor are connected together and used as the first end of the second inverter; a source of the second PMOS transistor is used as the second end of the second inverter; a drain of the second PMOS transistor and a drain of the second NMOS transistor are connected together and used as the fourth end of the second inverter; and a source of the second NMOS transistor is used as the third end of the second inverter.

3. The electrostatic discharge protection circuit of claim 1, wherein the pulse detection circuit comprises a resistor and a capacitor, and the resistor has a first end used as the first end of the pulse detection circuit, and a second end used as the third end of the pulse detection circuit; the capacitor has a first end connected to the second end of the resistor, and a second end used as the second end of the pulse detection circuit.

4. The electrostatic discharge protection circuit of claim 3, wherein the resistor is a polysilicon resistor or a doped resistor.

5. The electrostatic discharge protection circuit of claim 3, wherein the capacitor is a metal-dielectric layer-metal capacitor or a Metal-Oxide-Semiconductor (MOS) capacitor.

6. The electrostatic discharge protection circuit of claim 3, wherein a product of resistance of the resistor and capacitance of the capacitor has a value from 0.01 us to 1 us.

7. The electrostatic discharge protection circuit of claim 1, wherein the discharge circuit comprises a discharge transistor.

8. The electrostatic discharge protection circuit of claim 7, wherein the discharge transistor comprises an NMOS transistor; a gate of the discharge transistor is used as the third end of the discharge circuit; a drain of the discharge transistor is used as the first end of the discharge circuit; and a source of the discharge transistor is used as the second end of the discharge circuit.

* * * * *